United States Patent [19]

Ogletree

[11] Patent Number: 5,579,477
[45] Date of Patent: Nov. 26, 1996

[54] TEST CIRCUITRY FOR PRINTER MEMORY

[75] Inventor: Thomas M. Ogletree, Austin, Tex.

[73] Assignee: Compaq Computer Corporation, Houstin, Tex.

[21] Appl. No.: 616,764

[22] Filed: Mar. 15, 1996

Related U.S. Application Data

[63] Continuation of Ser. No. 279,448, Jul. 25, 1994, abandoned.

[51] Int. Cl.[6] ........................... G06F 11/00
[52] U.S. Cl. ........................... 395/183.2; 395/183.16
[58] Field of Search ..................... 395/183.2, 183.16, 395/183.07, 183.01; 364/518

[56] References Cited

U.S. PATENT DOCUMENTS

| | | | |
|---|---|---|---|
| 4,646,259 | 2/1987 | Lincoln et al. | 364/900 |
| 4,742,483 | 5/1988 | Morrell | 395/575 X |
| 4,757,503 | 7/1988 | Hayes et al. | 371/21.1 |
| 4,846,597 | 7/1989 | Bryant et al. | 400/472 |

Primary Examiner—Robert W. Beausoliel, Jr.
Assistant Examiner—Ly V. Hua
Attorney, Agent, or Firm—Vinson & Elkins L.L.P.

[57] ABSTRACT

A printer has test circuitry external to its processor to test memories used inside the printer. The test is initiated by the processor by signalling the test circuitry. The test circuitry stores a first sequence in each memory then reads the sequence from the memory and compares the memory's data to the original sequence. The test is repeated with a second sequence which is the logical inverse of the first sequence. If an error occurs, a flag is set. When the test is complete, the processor is notified. The processor can check the error flag to determine whether the test was successful.

7 Claims, 4 Drawing Sheets

TEST CIRCUITRY FOR PRINTER MEMORY

RELATED APPLICATIONS

This application is a Continuation of application Ser. No. 08/279,448, filed Jul. 25, 1994, and entitled "Test Circuitry for Printer Memory," now abandoned.

TECHNICAL FIELD OF THE INVENTION

This invention relates in general to computers and more particularly to test circuitry for testing memory in a printer.

BACKGROUND OF THE INVENTION

Laser printers often use several memory circuits for storing information during operation of the printer. For proper operation, it is important that each of the memories is in proper operating condition. There are a number of reasons why a memory may fail: a bit in the memory may stick to either a logical "1" or a logical "0", a bit may be unstable and switch between logic states, a low impedance path may exist between data bits of a word, or a low impedance path may exist between bits addressing the memory. It is desirable, therefore, to test the laser printer's memory circuits prior to beginning operation of the laser printer.

Most printers, and all laser and inkjet printers, contain a memory for storing data and instructions defining the image to be printed. Some laser jet printers additional contain additional memory for use in enhanced features, such as anti-aliasing and image decompression. In cases where the memory must operate at high speeds, one or more SRAMs (Static Random Access Memory) are used, as opposed to the DRAMs (Dynamic Random Access Memory), which typically are used to store the data and instructions.

In the prior art, the printer's processor executes a subroutine, as part of its power-up self-test, that writes data to each memory location and reads the data from memory to verify that the information was properly saved. Typically, the test is uncomplicated and will not detect all of the possible problems listed above. More complex tests require more processor cycles for each memory location tested and, therefore, increase the time to perform the test. More importantly, more complex tests reduce the rate at which the processor can access the memory. Therefore, the memory is not tested at the same speed which would be required during operation of the printer. Consequently, the tests are inadequate to verify the integrity of the memory at normal operating speeds.

Therefore, a need has arisen in the industry for a printer with a memory testing circuit which tests memory at substantially its normal operating speed.

SUMMARY OF THE INVENTION

The printer of the present invention uses a processor for controlling the print engine responsive to data from a computer. One or more memory circuits are used in conjunction with the processor for storing information during the operation of the printer. Test circuitry is provided external to the processor for accessing the memory prior to the printing operation to test the integrity of the memory at normal operating speeds.

In one aspect of the invention, two sequences are stored to the memories during testing, the first being an "odd-walking one pattern" and the second being an "odd-walking zero pattern", these two patterns being logical inverses of one another. Consequently, each bit in the memory is tested for storing both a "1" and "0". These patterns also test to ensure that two or more data bits are not shorted and two or more address pins are not shorted.

The present invention provides a significant advantage over the prior art in that the memory is tested at normal operating speeds, independent of the processor, which provides a more robust test of the printer memory, particularly in high-speed memory, such as SRAMs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1A:
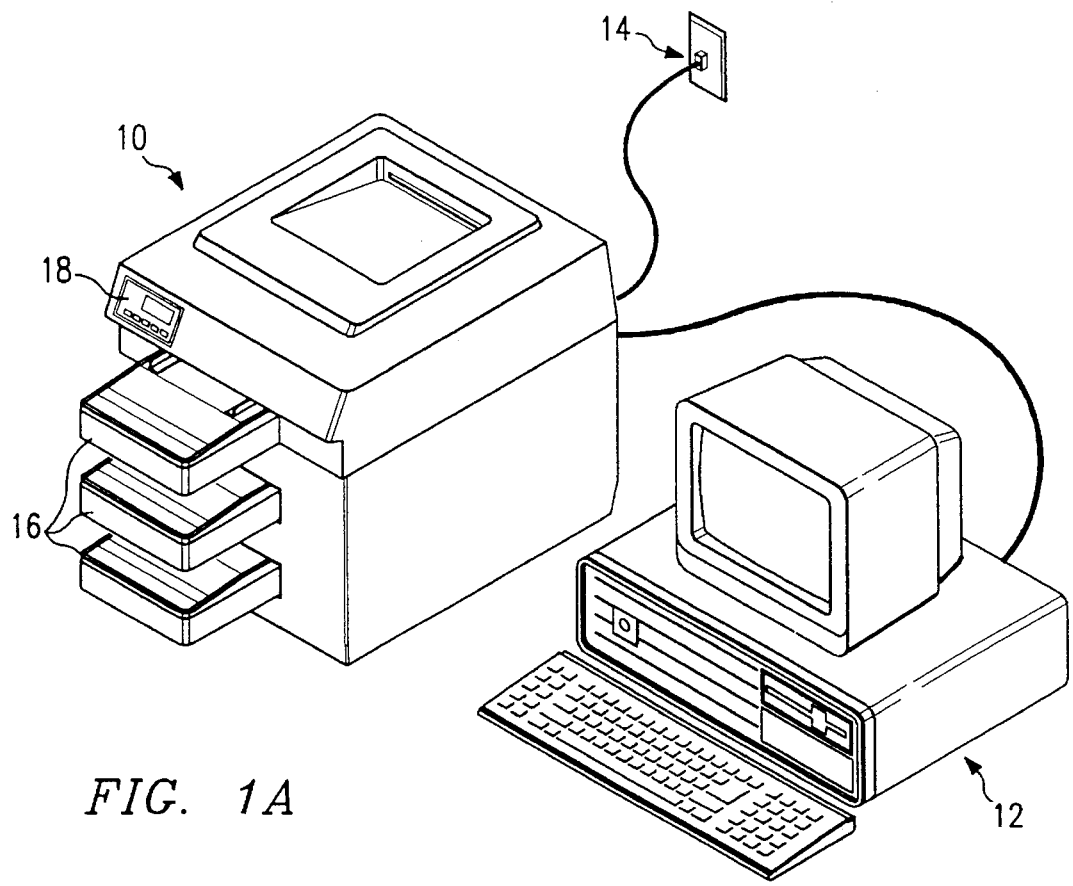
FIGS. 1a, 1b and 1c illustrate overall block diagrams of a laser printer using a preferred embodiment of the test circuitry.
Figure 1B:
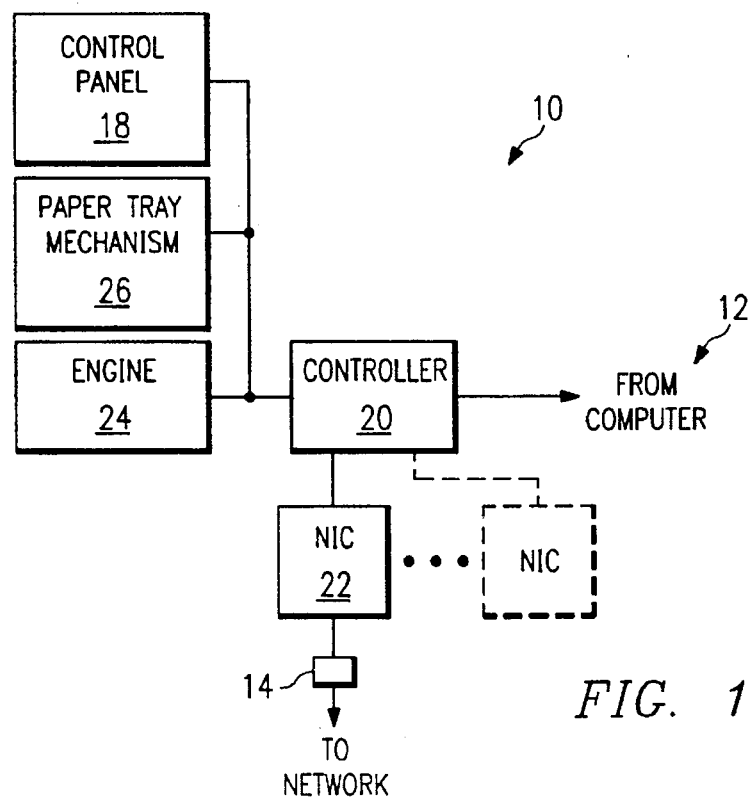
Figure 1C:
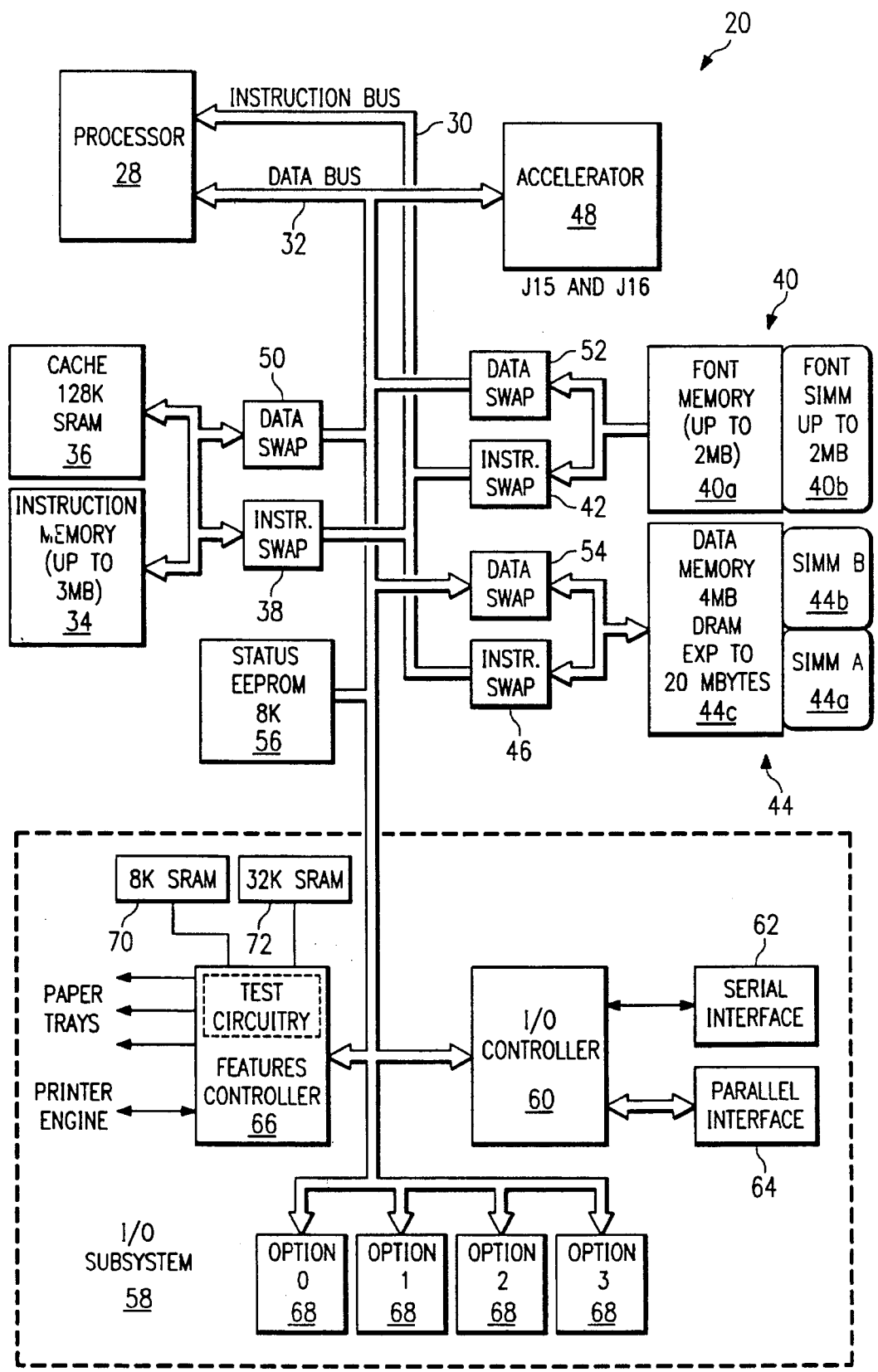
Figure 2:
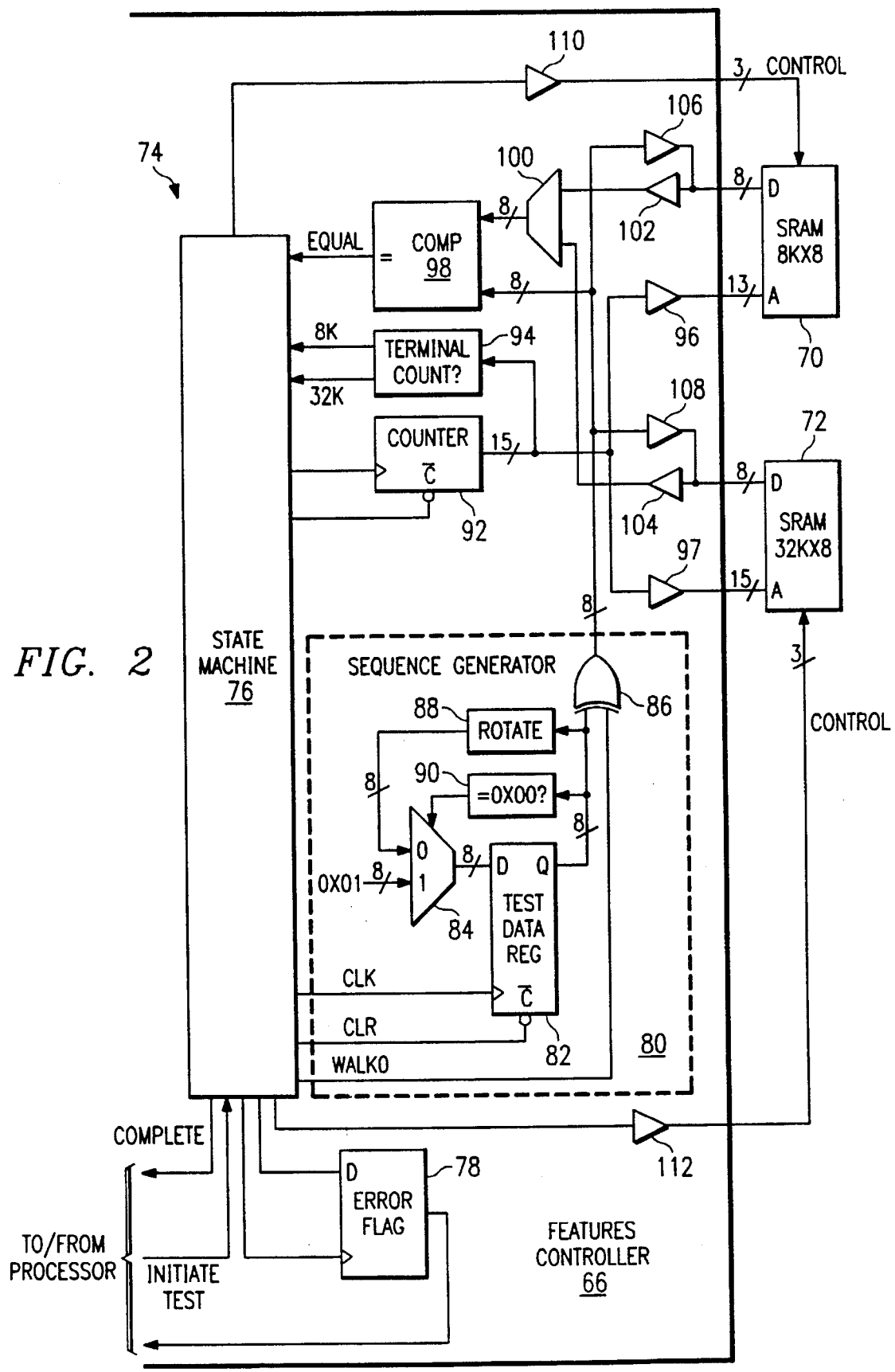
FIG. 2 illustrates a block diagram of the test circuitry.
Figure 3:
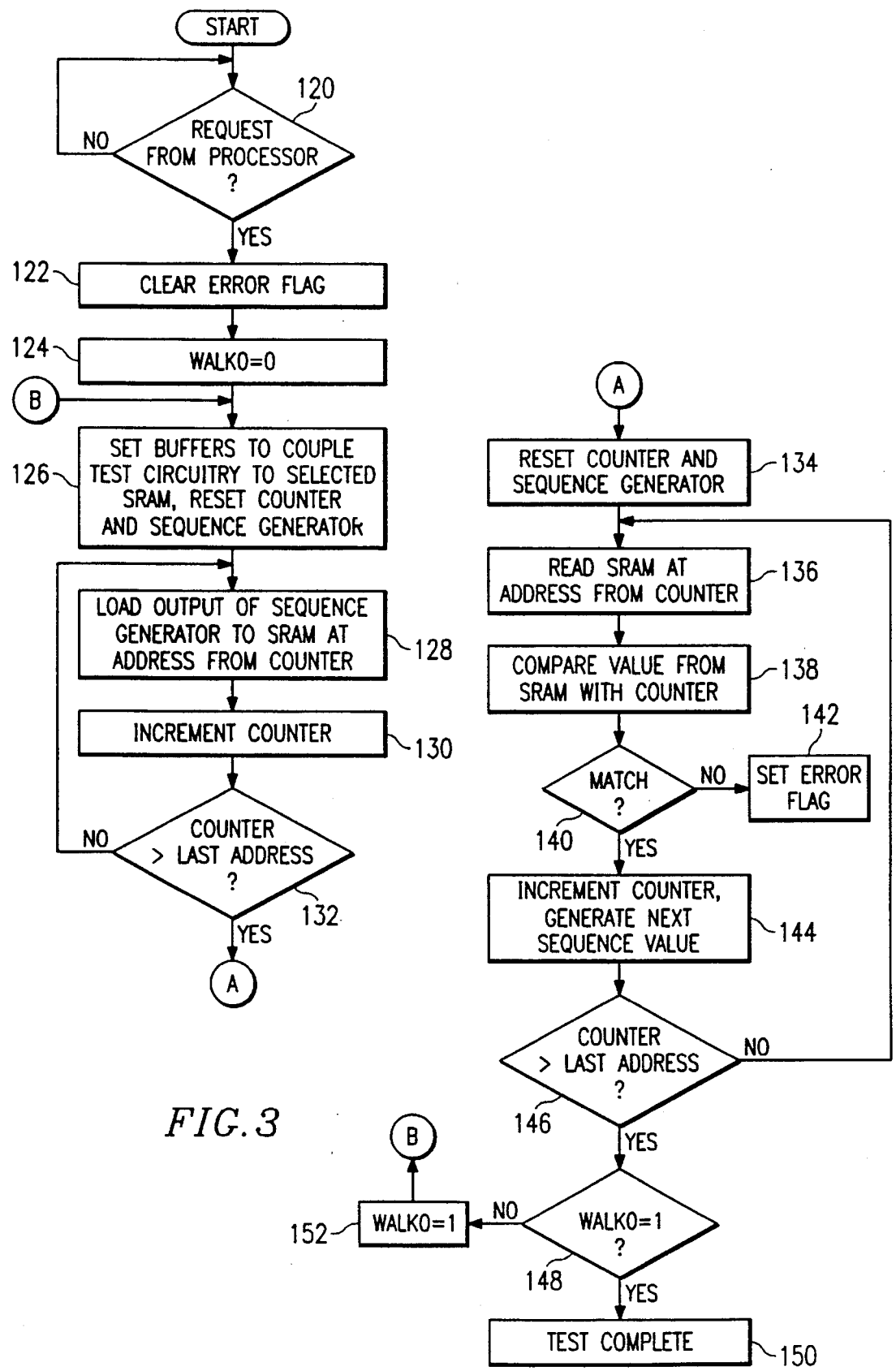
FIG. 3 illustrates a flow chart describing operation of the test circuitry while testing the memories.

The preferred embodiment of the present invention and its advantages are best understood by referring to FIGS. 1–3 of the drawings, like numerals being used for like and corresponding parts of the various drawings.

FIGS. 1a and 1b illustrate an exemplary printer architecture which can be used in conjunction with the preferred embodiment of the present invention. FIG. 1a shows a network printer 10 coupled to a computer 12 and to a jack 14 which is connected to the network. Computer 12 may be any type of computer, such as the IBM-compatible computers manufactured by Compaq Computer Corporation of Houston, Tex. The jack 14 is coupled through a network interface card (NIC) to the printer 10. Using an appropriate NIC, the printer 10 may be coupled to any type of network environment, such as Token Ring, Ethernet or AppleTalk. Network printer 10 includes a plurality of paper trays 16 and a control panel 18 for allowing user configuration of the printer.

In operation, the printer 10 may be hooked directly to a computer through a parallel port (not shown) and to one or more networks through associated jacks 14.

FIG. 1b illustrates a block diagram of the printer 10. Controller 20 is coupled to the computer 12, jack 14 (through NIC 22), the print engine 24, the paper tray mechanism 26, and the control panel 18.

The primary purpose of the controller 20 is to accept printer commands via the computer 12, network, or other input device, translate the printer commands and provide a compatible output to the print engine 24. The print engine 24 generates a printed page responsive to the output of the controller 20.

The controller 20 receives printer commands which are formatted in a page description language. In the preferred embodiment, either PCL5 (defined by Hewlett-Packard of Palo Alto, Calif.) or a Postscript language (defined by Adobe Systems, of Palo Alto, Calif.) are used. The commands are interpreted by the controller 20 to develop bit-mapped image of the page to be printed. Once the bit-mapped image is completed, the controller 20 rasterizes the image and passes it to the engine in the form of a serial bit stream similar to a video signal. The controller 20 also controls operation of the paper trays 16 through the paper tray mechanism 26 and interfaces with the control panel 18.

In the preferred embodiment, a laser print engine is used in the printer. However, the present invention is compatible with other print technologies, such as ink jet, thermal transfer, dot-matrix and others.

FIG. 1c illustrates a block diagram of the controller 20. The controller 20 shown in FIG. 1c includes a processor 28, such as an Advanced Micro Devices 29000 RISC processor, which uses separate instruction and data buses 30 and 32, respectively. The instruction bus 30 is coupled to instruction memory 34 and cache memory subsystem 36 through instruction swap buffer 38, to font memory 40 through instruction swap buffer 42, and to data memory 44 through instruction swap buffer 46. Data bus 32 is coupled to accelerator 48, instruction memory 34 and cache memory subsystem 36 through data swap buffer 50, to font memory 40 through data swap buffer 52, to data memory 44 through data swap buffer 54, to status memory 56 and to the I/O control subsystem 58. The I/O control subsystem 58 comprises an I/O controller 60, coupled to data bus 32 and to serial interface 62 and parallel interface 64. I/O control system 58 further comprises a features controller 66 which performs the IET (Image Enhancement Technology), image decompression and engine interface functions. Features controller 66 is coupled between the data bus 32 and the printer engine 24 and paper tray mechanism 26, and a plurality of option slots 68 coupled to the data bus 32. SRAMs 70 and 72 are coupled to the features controller 66. Features controller 66 includes test circuitry 74.

It should be noted that the particular architecture described above is for illustrative purposes. The test circuitry described further herein can be used with various architectures, as would be known to one skilled in the art.

Features controller 66 enhances the bit-mapped images for the engine and performs decompression of the bit-mapped image from data memory 44, if necessary. Test circuitry 74 confirms the operational integrity of the SRAMs 70 and 72 and the connections thereto.

The accelerator 48 increases the speed of processing the font data to produce the bit-mapped image. In the preferred embodiment, the accelerator 48 is built around the Adobe Systems "Snapshot" chip or "Type I" chip.

The controller 20 incorporates a direct-mapped, look-aside, cache memory subsystem 36. In the preferred embodiment, the cache memory comprises a cache controller and a static RAM (SRAM) which is 128 k×32-bit in size. The instruction cache memory subsystem 36 decodes each access to an instruction within memory. If the instruction has been accessed previously, and is still valid, the cache controller will terminate the instruction access to memory and supply the required instruction. Because the access time of the SRAM memory of the cache subsystem 36 is much faster than the instruction memory 34, instructions are provided from the cache subsystem 36 without wait states, thus improving performance.

The instruction memory 34, in the preferred embodiment, comprises an instruction ROM for nonvolatile storage of the program code executed by the 29000 processor. Some the tasks stored in the instruction ROM are: (1) real-time communication with I/O devices, (2) Postscript level two emulation and code interpretation, (3) PCL5 emulation and command translation, and (4) power on self-test. In the preferred embodiment, the instruction memory 34 comprises three megabytes of memory. To increase the speed of the instruction ROM, multiple ROM chips may be interleaved.

The data memory 44, in the preferred embodiment, comprises a dynamic RAM memory. Preferably, the data memory comprises an onboard memory in conjunction with user-installable data modules, such as DRAM SIMMs. In the illustrated embodiment, data memory 44 comprises two SIMMs, 44a and 44b, and onboard memory 44. Using two (or more) SIMMs allows the memory to be interleaved for greater speed. The data memory 44 provides a temporary storage area for data and program code utilized by the processor 28 and execution of its tasks.

The data memory 44 may be used as a scratch pad for data or code to be used repetitively. The primary uses of the data memory 44 are: (1) storage of Postscript and PCL5 commands for processing, (2) storage of the display list, the intermediate stage of processing Postscript code, (3) storage of the bit-mapped image of the page that is sent to the print engine to be printed, and (4) execution of diagnostics down-loaded from host device or printer diagnostic tool.

The font memory 40 is used to store the font information for the printer 10. In the preferred embodiment, the font memory 40 is used to contain the Adobe Postscript level II and PCL5 scalable font outlines for the resident fonts in the printer. The font memory can be categorized as an on-board memory 40a with an optional programmable font module 40b. The on-board font memory 40a comprises, in the preferred embodiment, two megabytes of ROM, while the programmable font module 40b comprises one or two megabytes of flash EPROM memory. The programmable font module 40b is preferably a SIMM module which may be optionally plugged into the controller 20.

The programmable font module 40b allows fonts to be loaded from a device via an I/O port, such as the serial and printer interfaces 62 and 64, or via the option slot 68.

The status memory 56 is made up of eight kilobytes of EEPROM memory. The status memory 56 is used to store configuration data and any other information that needs to be retained when power is removed. Such data may include printer configuration data, font setup, option setup, error message log and user parameters. For speed and convenience, it is desirable that the font memory be organized as 32-bit words to correspond to the 32-bit data and instruction buses.

The I/O controller subsystem 58 provides the support required to communicate to all devices external to the controller 20. The firmware controls the reception and transmission of data to external devices.

The serial, parallel and option ports can be configured such that they are active concurrently and able to receive print commands simultaneously. To facilitate the "all ports active" mode of operation, the processor 28 monitors the communications and I/O controllers for input from their associated ports. When data is received, the processor 28 moves the data to an area in the DRAM 44 dedicated to that port for processing. If multiple ports are receiving data, a prior scheme must be used to determine which job is to be printed first.

The options interface includes the four option slots 68. A processor 28 senses the presence and type of the option plugged into each slot and makes the appropriate entries into the configuration tables. In the preferred embodiment, the option slots 68 may receive input from NIC, fax circuits and other input devices. Each option can be enabled and disabled via the control panel 18 or software commands.

A block diagram of the test circuitry 74 is shown in FIG. 2. Test circuitry 74 includes a state machine 76 which communicates with the processor 28. The state machine 76 is further coupled to a latch 78 having an output coupled to the processor 28. A sequence generator 80 comprises a register 82 having a input coupled to the output of multiplexer 84 and an output coupled to exclusive-or gate 86. The output is also coupled to a shift register 88 and a comparator 90. Multiplexer 84 has a one input coupled to a preset value (0×01 ["0×" used throughout to denote hex values]) and the other input coupled to the output of shift register 88. The output is selected by the output of comparator 90. Register 82 is clocked by a CLK signal from state machine 76 and is selectively cleared by a CLR signal from state machine 76. A WALK0 signal is coupled to the other input of exclusive-or gate 86.

A counter 92 has its clock and compare inputs coupled to state machine 76. The output of counter 96 is coupled to a comparator 94 and to buffers 96 and 97. The outputs of buffers 96 and 97 are coupled to the address ports of SRAMs 70 and 72. Comparator 94 has two outputs indicating a counter output of 8K and 32K; these outputs are coupled to state machine 76.

A comparator 98 has one input coupled to the output of exclusive-or gate 86 and another input coupled to the output of a multiplexer 100. The output of counter 94 is coupled to the state machine 76. Multiplexer 100 has inputs coupled to the outputs of buffers 102 and 104. Buffers 102 and 104 have inputs coupled to the data port of SRAMs 70 and 72, respectively. The output of exclusive-or gate 86 is also coupled to the inputs of buffers 106 and 108, which have outputs coupled to the data ports of SRAMs 70 and 72, respectively. State machine 76 also outputs control signals to SRAMs 70 and 72 through buffers 110 and 112, respectively.

Although not shown in FIG. 2, the SRAMs 70 and 72 have separate connections to the ASIC for accessing the SRAMs during normal operation of the printer.

In operation, the sequence generator 80 can generate either a "Odd Walking Ones" or an "Odd Walking Zero" sequence. These sequences are provided in Table I. As can be seen, each value of the Odd Walking One sequence is the logical inverse of the corresponding value of the Odd Walking zero sequence. The inversion is effected by the exclusive-or gate 86 (the exclusive-or gate shown is actually eight exclusive-or gates in parallel, one for each data bit in the test pattern data path). When the WALK0 signal is a logical low, the Odd Walking One sequence is output from register 82 and passes through exclusive-or gate 86 unchanged. When the WALK0 signal is a logical high, the output of register 82 is inverted and hence the Odd Walking Zero sequence is output from the exclusive-or gate 86. Each sequence repeats every nine bytes. Although the SRAMs shown in the illustrated embodiment store a byte at each addressable location, the sequence could be modified for any word size.

TABLE I

| Memory Location | Odd Walking One Value | Odd Walking Zero Value |
| --- | --- | --- |
| 0x00 | 00000001 | 11111110 |
| 0x01 | 00000010 | 11111101 |
| 0x02 | 00000100 | 11111011 |
| 0x03 | 00001000 | 11110111 |
| 0x04 | 00010000 | 11101111 |
| 0x05 | 00100000 | 11011111 |
| 0x06 | 01000000 | 10111111 |
| 0x07 | 10000000 | 01111111 |
| 0x08 | 00000000 | 11111111 |
| 0x09 | 00000001 | 11111110 |

TABLE I-continued

| Memory Location | Odd Walking One Value | Odd Walking Zero Value |
| --- | --- | --- |
| 0x0A | 00000010 | 11111101 |
| 0x0B | 00000100 | 11111011 |
| 0x0C | 00001000 | 11110111 |
| 0x0D | 00010000 | 11101111 |
| 0x0E | 00100000 | 11011111 |
| 0x0F | 01000000 | 10111111 |
| 0x10 | 10000000 | 01111111 |
| 0x11 | 00000000 | 11111111 |

The Odd Walking One sequence is generated by register 82, shift register 88, comparator 90 and multiplexer 84. Initially, register 82 is loaded with 0×01. On each active edge of CLK from the state machine 76, the value from the register is shifted to the left, filling the least significant bit with a "0". The value from the shift register 88 is loaded into register 82, unless the value of register 82 is 0×00, in which case 0×01 is loaded into register 82, restarting the sequence.

FIG. 3 illustrates the testing of the SRAMs as controlled by state machine 76. In block 120, the state machine waits for a request from the processor 28 for a memory test of the SRAMs 70 and 72. This test is typically requested as part of the start-up test of the printer. Register 78, which holds the error flag, is cleared by the state machine 76 in block 122. In block 124, WALK0 is set to "0" to select the Odd Walking One sequence. In block 126, the various buffers are set to couple the test circuitry 74 to one of the SRAMs 70 or 72. Counter 92 and sequence generator 80 are reset at this point as well.

The output of the sequence generator 80 (i.e., the output of exclusive-or gate 86) is written to the selected SRAM at the address set by the output of counter 92 (block 128). In block 130, the counter is incremented. So long as the value of the counter 92 is less than or equal to the address of the last location in the selected SRAM (i.e., 8K or 32K) in block 132, then blocks 128 and 130 are repeated. Once the value of counter 92 exceeds the last address of the selected memory in block 132, the sequence is fully loaded in the selected SRAM.

In block 134, counter 92 and sequence generator 80 are reset. The selected SRAM is read at the address Set by counter 92 (block 136) and is compared to the output of the sequence generator 80 using comparator 98 (block 138). If the two values do not match in block 140, the error flag (register 78) is set by the state machine 76 in block 142, and the test can be terminated. If the values do match in decision block 140, the counter is incremented and the next sequence value is generated in block 144. So long as the value output from counter 92 is less than or equal to the last address of the selected SRAM in decision block 146 (as determined by comparator 94), successive values are read from the selected SRAM and compared with the corresponding sequence from the sequence generator 82 (blocks 136–144). When the counter exceeds the last address of the selected SRAM, the test for the sequence is finished. In decision block 148, if WALK0="1" the test has been completed for both the Odd Walking One and Odd Walking Zero sequences and the test is complete in block 150. Upon completion, the state machine 76 signals the processor 28 If WALK0="0" in decision block 148, then WALK0 is set to 1 in block 152 and the next test is performed starting at block 126.

It should be noted that the flow chart of FIG. 3 illustrates the test for a single SRAM; in operation, the test would be performed on both SRAMs shown in FIG. 2. Depending on the configuration of the printer, the test could also be used on other memories, using either the same test circuit 74 or multiple test circuits similar to that shown in FIG. 2.

The test circuitry 74 provides significant advantages over the prior art. Importantly, both writing to an SRAM and reading (and verifying) from the SRAM can be done on each clock from the state machine, which is not limited to the speed of the processor clock. The clock from the state machine could be set at a given speed or programmably adjustable. Therefore, the SRAMs are written to and read from at a clock rate which operates substantially at the normal operating speed of the SRAMs. In the preferred embodiment, the SRAMs should be tested at ±15–20% of their operating speed. Were the testing performed by the processor 28 or other programmable device, several clock cycles would be need to generate the sequence values and address, and therefore, the test would be performed at a speed significantly less than the speed at which the SRAMs would be accessed during normal operation of the printer. Thus, the test circuitry will detect memory errors that are affected by the access speed of the memories. Further, if large memories are being tested, the speed of the test will be reduced and the processor 28 can perform other tests and start-up functions while the test circuitry 74 is testing the memories.

Because each bit in the SRAMs will be tested with both a "1" and a "0", the test will catch any bit in the SRAM which is stuck on either logical value. The Odd Walking One sequence will detect any failure due to two or more data pins being shorted. By using a sequence which repeats at an odd interval (in this case, the pattern repeats every nine bytes), failures due to address bits being stuck high or low or two or more address pins being shorted is detectable because the pattern size does not lie on a binary address boundary. For example, if the sequence repeated every eight bytes, and bit "2" of the address pins was stuck high (bit "0" being the least significant bit of the address), an error would not be detected, since the sequence would repeat for all affected addresses. Test circuitry 74 will detect such errors, because the sequence does not repeat at binary boundaries.

Although the present invention and its advantages have been described in detail, it should be understood that various changes, substitutions and alterations can be made herein without departing from the spirit and scope of the invention as defined by the appended claims.

What is claimed is:

1. A printer comprising:
    a print engine;
    a processor for controlling said engine responsive to data from a computer;
    one or more memory circuits for storing information during printing operation of the printer;
    test circuitry external to said processor for accessing said one or more memory circuits prior to printing operation for testing the proper operation of said one or more memory circuits such that the testing is controlled and executed by said test circuitry and not by said processor.

2. The printer of claim 1 wherein said memory is accessed at a first speed during print operations and said test circuitry accesses said memory at substantially the same speed.

3. The printer of claim 1 wherein said test circuitry comprises circuitry for:
    generating a first sequence of data and storing said first sequence in said memory;
    reading the first sequence stored in said memory and comparing the first sequence read from said memory with the generated first sequence;
    generating a second sequence of data and storing said second sequence in said memory, said second sequence being the logical inverse of said first sequence; and
    reading the second sequence stored in said memory and comparing the second sequence read from said memory with the generated second sequence.

4. The printer of claim 3 wherein said test circuitry comprises:
    a data word memory for storing data words used in generating the first and second sequences;
    a shift register coupled to said data word memory for receiving a data word from said data word memory and shifting logical bits of the received data word; and
    circuitry for storing the shifted data word from the shift register into said data word memory.

5. The printer of claim 4 and further comprising circuitry for receiving a data word from said data word memory and selectively inverting the received data word.

6. The printer of claim 4 and further comprising circuitry to compare the data word stored in said data word memory with a predetermined value.

7. The printer of claim 1 and wherein said test circuitry comprises circuitry for generating a sequence of data which comprises an odd number of data words.

* * * * *